United States Patent
Roth

(10) Patent No.: US 9,310,561 B1
(45) Date of Patent: Apr. 12, 2016

(54) MULTIPORT PHOTONIC DEVICE WITH ASYMMETRIC WAVEGUIDES

(71) Applicant: Aurrion, Inc., Goleta, CA (US)

(72) Inventor: Jonathan Edgar Roth, Santa Barbara, CA (US)

(73) Assignee: Aurrion, Inc., Goleta, CA (US)

( * ) Notice: Subject to any disclaimer, the term of this patent is extended or adjusted under 35 U.S.C. 154(b) by 0 days.

(21) Appl. No.: 14/522,415

(22) Filed: Oct. 23, 2014

Related U.S. Application Data

(60) Provisional application No. 61/909,640, filed on Nov. 27, 2013.

(51) Int. Cl.
| | |
|---|---|
| *G02B 6/26* | (2006.01) |
| *G02B 6/42* | (2006.01) |
| *G02B 6/00* | (2006.01) |
| *G02B 6/27* | (2006.01) |
| *G02B 6/293* | (2006.01) |
| *G02F 1/313* | (2006.01) |
| *G02B 6/12* | (2006.01) |
| *G02F 1/01* | (2006.01) |

(52) U.S. Cl.
CPC ............ *G02B 6/2773* (2013.01); *G02B 6/2932* (2013.01); *G02F 1/3132* (2013.01); *G02B 6/2766* (2013.01); *G02B 2006/12147* (2013.01); *G02F 1/0136* (2013.01); *G02F 1/3133* (2013.01)

(58) Field of Classification Search
CPC ................. G02B 2006/12147; G02B 6/2766; G02B 6/2773; G02B 6/2932; G02B 6/29334; G02F 1/3132; G02F 1/3133; G02F 1/0136
USPC .................................... 385/1-4, 9, 11, 30, 42
See application file for complete search history.

(56) References Cited

U.S. PATENT DOCUMENTS

| | | | | |
|---|---|---|---|---|
| 4,778,235 | A * | 10/1988 | Fujiwara ............................ 385/8 |
| 5,648,978 | A * | 7/1997 | Sakata ......................... 372/50.11 |
| 6,084,997 | A * | 7/2000 | Utaka et al. ...................... 385/37 |
| 8,873,899 | B2 * | 10/2014 | Anderson ................ G02B 6/27 |
| | | | | 385/11 |
| 2003/0235370 | A1 * | 12/2003 | Taillaert ................. B82Y 20/00 |
| | | | | 385/50 |

(Continued)

FOREIGN PATENT DOCUMENTS

EP     0886151 A2    12/1998

OTHER PUBLICATIONS

"An optical tap based on the twin waveguide laser-amplifier with asymmetric flared output waveguides", by Mudhar et al, IEEE Photonics Technology Letters, vol. 4, No. 6, pp. 574-576, 1992.*

(Continued)

*Primary Examiner* — Robert Tavlykaev
(74) *Attorney, Agent, or Firm* — Schwegman Lundberg & Woessner, P.A.

(57) ABSTRACT

Embodiments describe optical devices including a first waveguide, comprising a first cross-sectional area, to receive a light comprising a first optical mode, and a second waveguide, adjacent to the first waveguide, to receive a light comprising a second optical mode orthogonal to the first optical mode. The second waveguide comprises a second cross-sectional area different than the first waveguide such that an absorption/gain coefficient of the second waveguide for light comprising the second optical mode is equal to an absorption/gain coefficient of the first waveguide for light comprising the first optical mode. The optical devices may comprise modulators, photodetectors, or semiconductor optical amplifiers (SOAs).

22 Claims, 8 Drawing Sheets

(56) References Cited

U.S. PATENT DOCUMENTS

| | | | |
|---|---|---|---|
| 2008/0025665 A1* | 1/2008 | Little | G02B 6/126 385/30 |
| 2013/0156361 A1* | 6/2013 | Kojima | G02B 6/14 385/11 |
| 2013/0188971 A1* | 7/2013 | Painchaud | H04B 10/612 398/214 |
| 2015/0131942 A1* | 5/2015 | Xu | G02B 6/34 385/37 |

OTHER PUBLICATIONS

"European Application Serial No. 14003946.2, Extended European Search Report mailed Apr. 10, 2015", 8 pgs.

Brouckaert, Joost, et al., "Thin-Film III-V Photodetectors Integrated on Silicon-on-Insulator Photonic ICs", Journal of Lightwave Technology, IEEE Service Center, New York, NY, US, vol. 25, No. 4, (Apr. 1, 2007), 1053-1060.

* cited by examiner

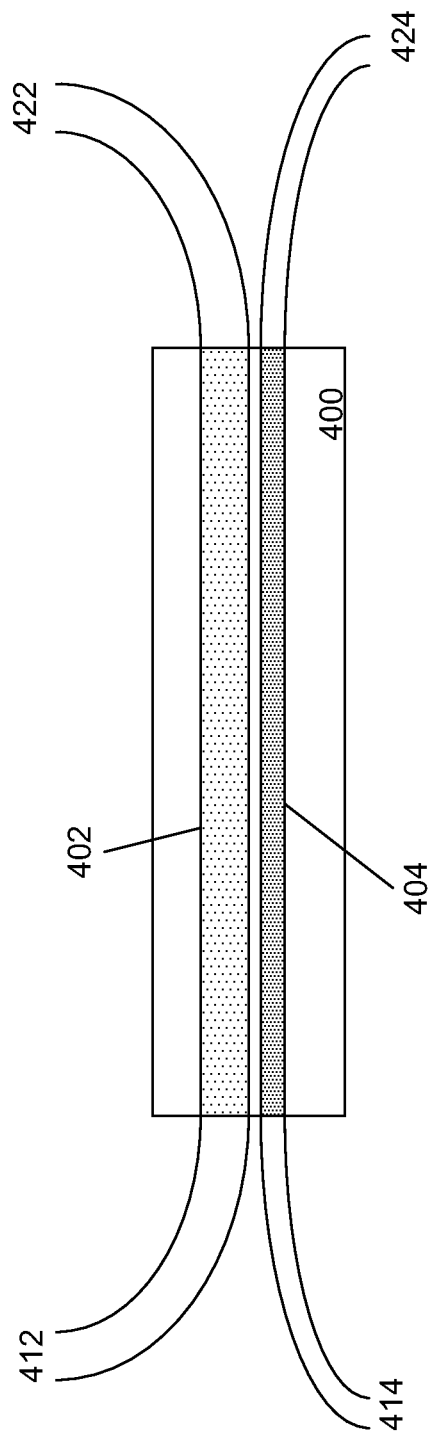

MULTIPORT PHOTONIC DEVICE WITH ASYMMETRIC WAVEGUIDES

PRIORITY

This application claims the benefit of U.S. Provisional Application No. 61/909,640 filed Nov. 27, 2013, the entire contents of which are hereby incorporated by reference herein.

FIELD

Embodiments of the disclosure generally pertain to the optical devices and more specifically to optical devices having two or more waveguides with asymmetric cross-sectional areas.

BACKGROUND

For interconnections to and within optical devices, polarization dependent effects, such as polarization dependent loss (PDL) or gain, may occur on the signals transmitted, received, and/or processed by these devices. These polarization dependent effects may cause unequal power levels for each polarization state, which may in turn cause the optical data carried by the signals to become distorted. Current solutions attempt to mitigate PDL by utilizing separate optical components and district optical paths within a device for different polarization states; however, such solutions detrimentally affect the bandwidth capabilities of the device and increase its size.

BRIEF DESCRIPTION OF THE DRAWINGS

The following description includes discussion of figures having illustrations given by way of example of implementations of embodiments of the disclosure. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

FIG. 4 is an illustration of an optical device according to an embodiment of the disclosure.

Descriptions of certain details and implementations follow, including a description of the figures, which may depict some or all of the embodiments described below, as well as discussing other potential embodiments or implementations of the inventive concepts presented herein. An overview of embodiments of the disclosure is provided below, followed by a more detailed description with reference to the drawings.

DESCRIPTION

Embodiments of the disclosure describe multiport photonic devices having asymmetric waveguide cross-sectional areas. Throughout this specification, several terms of art are used. These terms are to take on their ordinary meaning in the art from which they come, unless specifically defined herein or the context of their use would clearly suggest otherwise. In the following description numerous specific details are set forth to provide a thorough understanding of the embodiments. One skilled in the relevant art will recognize, however, that the techniques described herein can be practiced without one or more of the specific details, or with other methods, components, materials, etc. In other instances, well-known structures, materials, or operations are not shown or described in detail to avoid obscuring certain aspects.

Figure 1A:
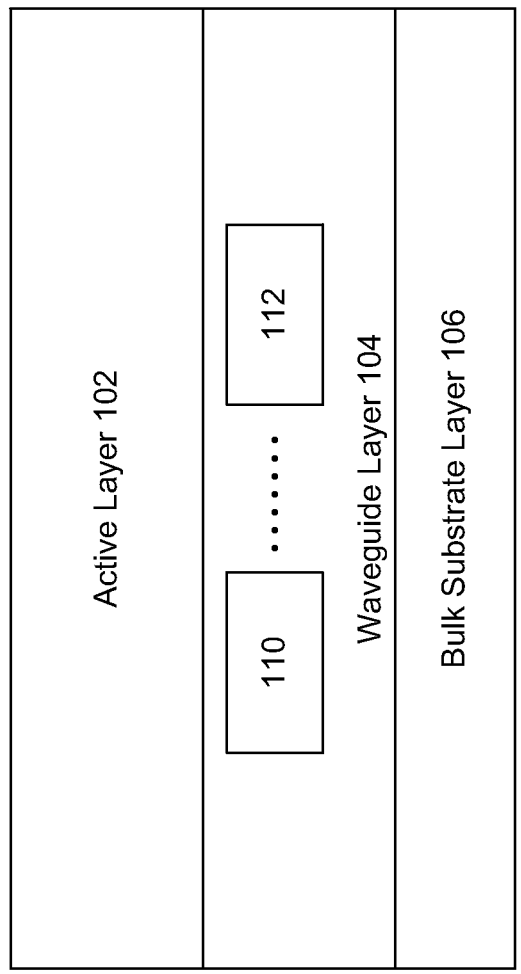
FIG. 1A and FIG. 1B are illustrations of an optical device according to an embodiment of the disclosure.
Figure 1B:
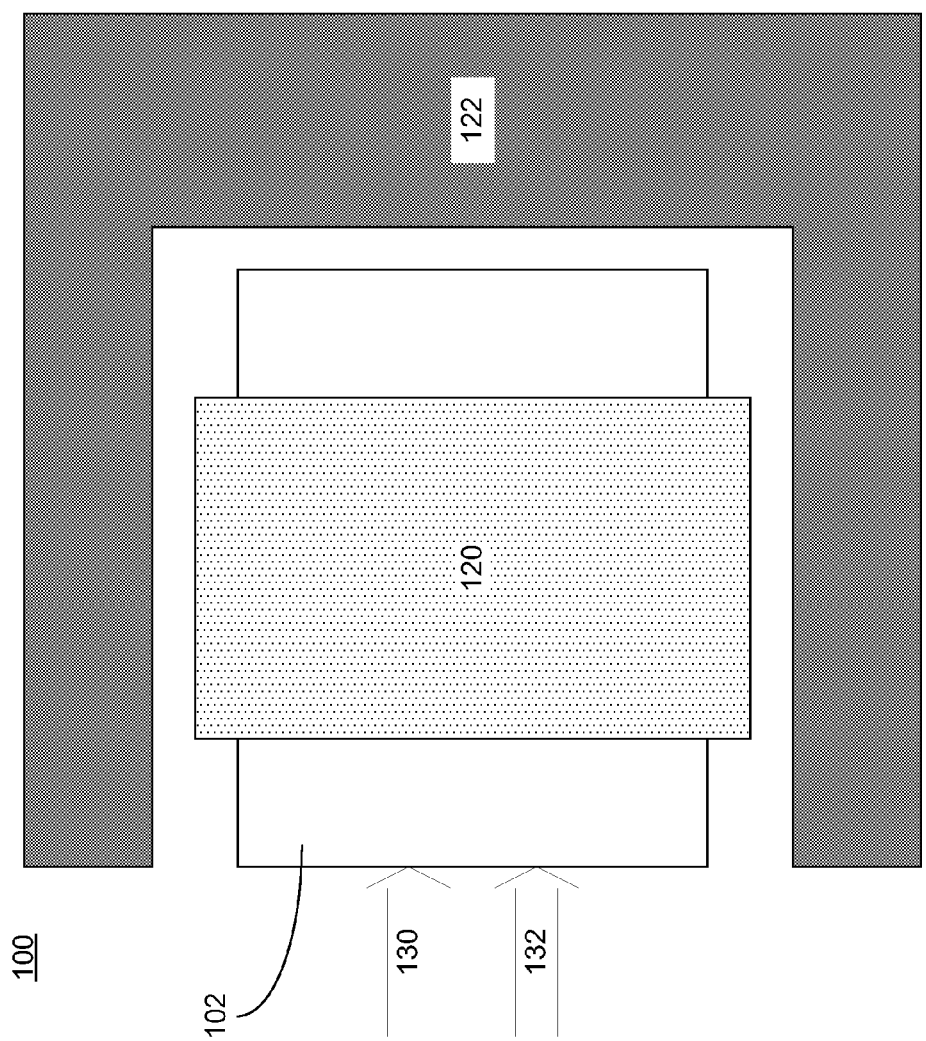

FIG. 1A and FIG. 1B are illustrations of an optical device according to an embodiment of the disclosure. Device 100 is shown in FIG. 1A to include active layer 102, waveguide layer 104, and bulk substrate layer 106. Device 100 may comprise any optical device such as a photodetector, modulator, or semiconductor optical amplifier (SOA). In embodiments where device 100 comprises a photodetector or modulator, layer 102 may alternatively be referred to as an absorption layer/region; in embodiments where device 100 comprises an SOA, layer 102 may alternatively be referred to as a gain layer/region. For photodetector embodiments, active layer 102 may comprise an abrupt, non-tapered edge overlapping the waveguides of waveguide layer 104.

Waveguide layer 104 is shown to include a plurality of waveguides, including waveguides 110 and 112. The waveguides of waveguide layer 104 each utilize the same active layer (i.e., active layer 102) in order to increase the bandwidth of the device and to reduce the device footprint. In some embodiments, layers 102 and 104 comprise the similar types of semiconductor materials—e.g., different III-V semiconductor materials, differently doped silicon (Si) semiconductor materials, etc. In other embodiments, device 100 comprises heterogeneous-integrated III-V/Si semiconductor material—e.g., active layer 102 comprises III-V semiconductor material and waveguide layer 104 comprises Si semiconductor material.

FIG. 1B illustrates device 100 further including p-electrode 120 disposed over active layer 102, and corresponding n-electrode 122. Light 130 and 132, each comprising different modes in the same polarization state that are orthogonal to one another, is received by the above described waveguides of the device. Device 100 may be used in a polarization diversity system, wherein light having different polarization states may be received from a fiber by a coupler to the photonic integrated circuit of which Device 100 is a part. For example, device 100 may comprise a photodetector used in a polarization diversity receiver, wherein waveguides 110 and 112 each receive single-mode optical signals 130 and 132, which are in the same polarization state. These optical signals may be from light that entered the receiver in one single mode waveguide in two orthogonal polarizations, as described below.

Figure 2A:
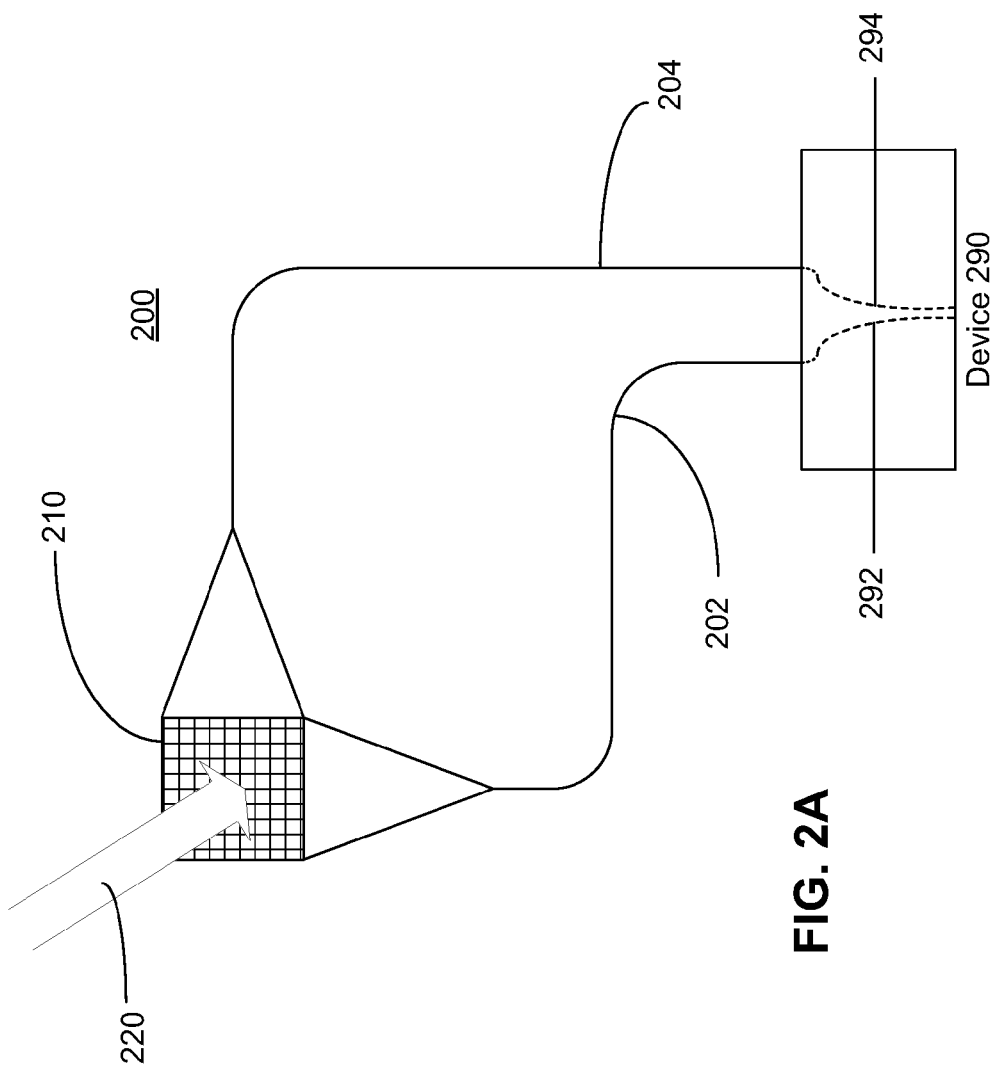
FIG. 2A and FIG. 2B are illustrations of a polarization diversity receiver including an optical device according to an embodiment of the disclosure.
Figure 2B:
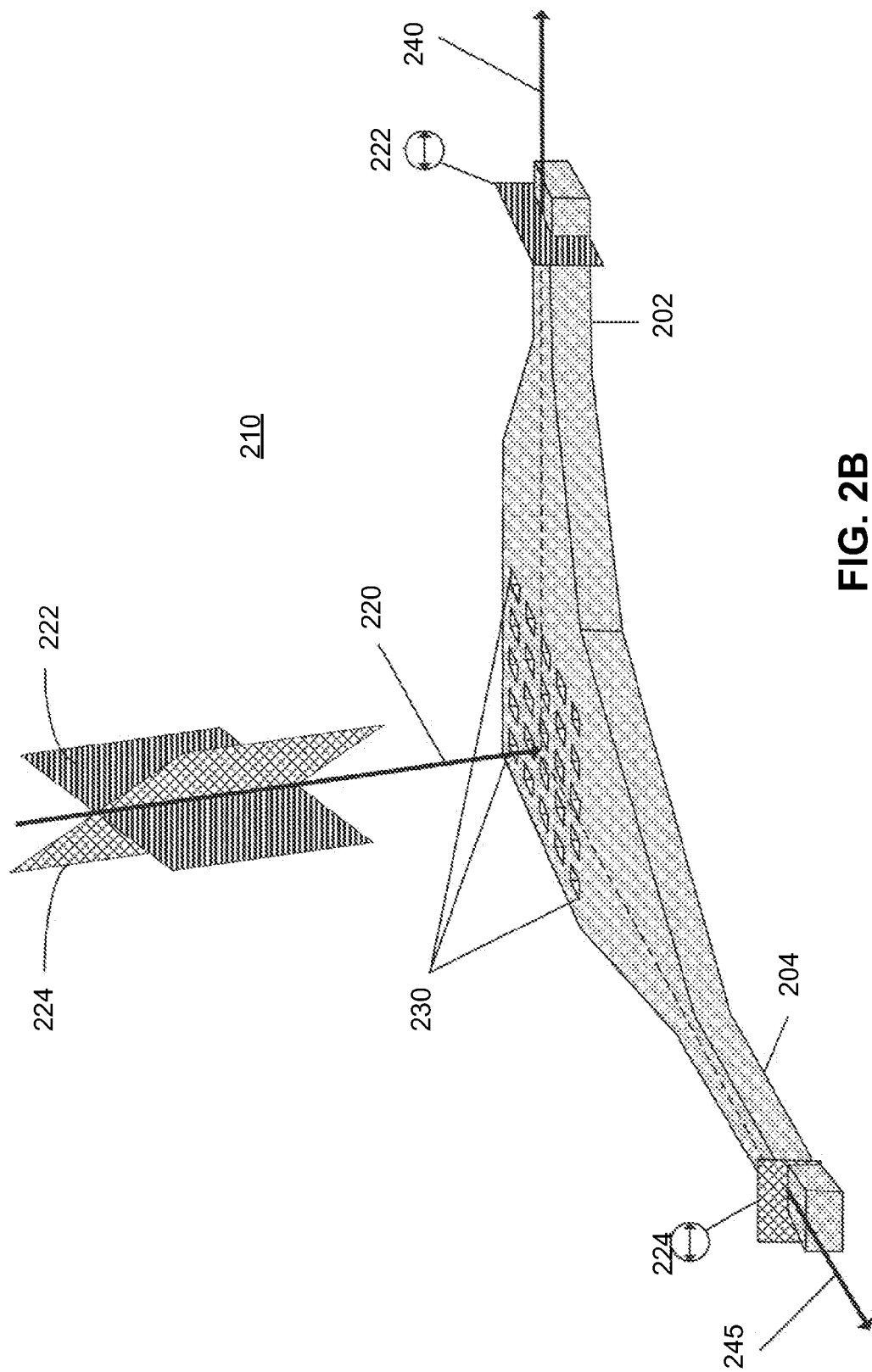

FIG. 2A and FIG. 2B are illustrations of a polarization diversity receiver including an optical device according to an embodiment of the disclosure. In FIG. 2A, polarization diversity receiver 200 is shown to include two-dimensional grating coupler 210 which receives light from fiber 220. This light is split based on its orthogonal polarization states and output to waveguides 202 and 204; device 290 is shown to receive light from the waveguides. The polarization diversity of the light that may be received from fiber 220 may result from, for example, temperature fluctuations, stress on the optical fiber, etc.

FIG. 2B is an illustration of a two-dimensional 2D grating coupler and splitter according to an embodiment of the disclosure. In this embodiment, 2D grating coupler and splitter 210 includes gratings 230, which are configured to couple light 222 having a first polarization state into waveguide 202, and light 224 having a second polarization state into waveguide 204, thereby splitting into orthogonal polarization components of light 220. For exemplary purposes, said first polarization state is illustrated as TE-polarization, and said second polarization state is illustrated as TM-polarization.

As shown in this illustration, light 240 output from waveguide 202 has TE-polarization with respect to the waveguide; however light 245 output from waveguide 204 has TE-polarization with respect to the waveguide, due to the orientation of waveguide 204 with respect to the light received at gratings 230. Thus, the TM and TE polarization components of light 220 will have the same polarization in waveguides 202 and 204, respectively, when said light is split by gratings 230 and transmitted to device 290 of FIG. 2A.

Referring back to FIG. 2A, waveguides 202 and 204 are spaced apart such that the modes of each waveguide are not coupled together. Within device 290, however, waveguides 292 and 294, which received light from waveguides 202 and 204, respectively, are positioned close enough to utilize the same active region. As this active region is reduced in size (in part, to reduce the size of active device 290 and to increase its bandwidth), waveguides 292 and 294 are positioned close enough for their respective modes to couple.

Furthermore, in this embodiment waveguides 202 and 204 are shown to enter active device 290 on the same side. This eliminates the possibility of back-reflection from the waveguides to propagate throughout the entire system (i.e., as opposed to prior art solutions which have two waveguides each disposed on opposing sides of the device). In devices having inputs enter the device from opposite sides, not all of the light is absorbed while passing through the active region of the device, especially in high-speed/bandwidth applications. For example, in photodetector embodiments, some light that is not absorbed by photodetecting region may pass backwards through the waveguides designed to send light into the device. This backreflection behavior is described as having low return loss and can compromise the performance of photonic integrated circuits.

Figure 3A:
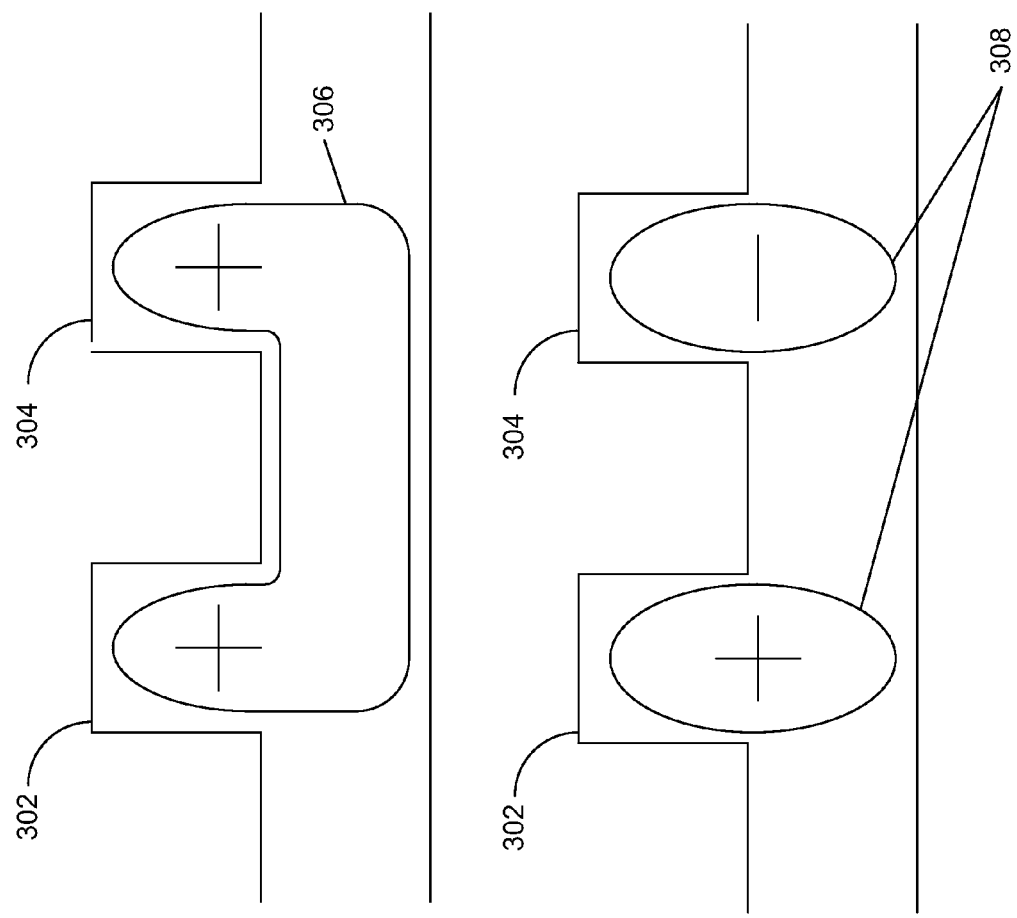
FIG. 3A and FIG. 3B are illustrations of waveguides included in an active device according to an embodiment of the disclosure.

FIG. 3A FIG. 3C are illustrations of waveguides included in an active device according to an embodiment of the disclosure. FIG. 3A illustrates a portion of device 300, including waveguides 302 and 304, and active layer 310. In FIG. 3A, waveguides 302 and 304 are waveguides shown to be disposed underneath active device 310; in other embodiments, external waveguides may be coupled to internal waveguides of a device. For exemplary purposes, active region 310 can be described below as a photodetection region; photodetection components may be used for converting an optical signal to an electronic signal in a polarization diversity receiver. Waveguides 302 and 304 are illustrated as comprising the same width outside of active region 310; however, in other embodiments, device waveguide widths outside of an active region can comprise the different widths.

Figure 3B:
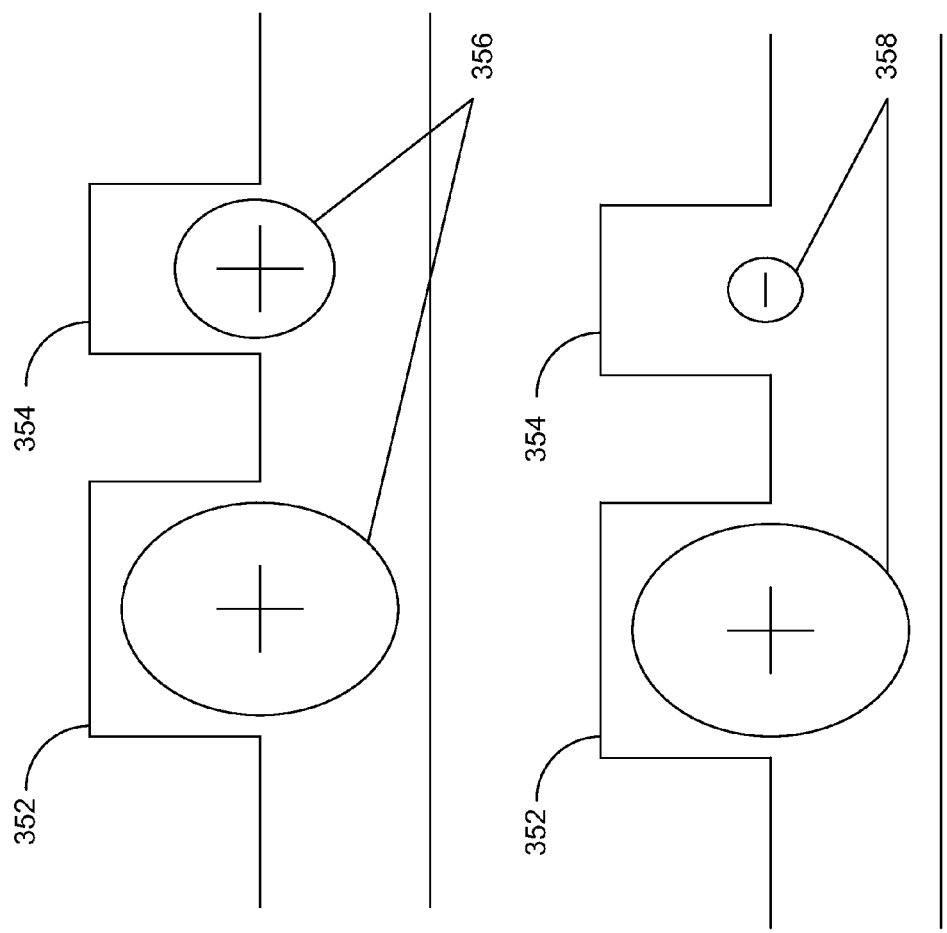

FIG. 3B illustrates waveguides 302 and 304 at active region 310. Shared photodetection region 310 (as shown in FIG. 3A) detects light in both of waveguides 302 and 304; thus, the detected light is "summed" together. Referring back to the example illustrated in FIG. 2A-2B, when two coherent light inputs having TE0 modes are close together, the field of one mode overlaps the field of the other mode; the modes couple and split into symmetric and anti-symmetric modes. In other words, the fundamental modes of waveguides 302 and 304 change from being spatially separate to (at active region 310) being close enough to couple. In this embodiment, the modes of waveguides 302 and 304 evanescently couple to each other forming symmetric optical mode 306 and anti-symmetric optical mode 308.

In this embodiment, the cross-sectional areas of waveguides 302 and 304 are shown to be relatively equal (i.e., symmetric in length and width). Because the fundamental symmetric and anti-symmetric modes have different absorption coefficients (i.e., modal confinement or gain coefficient in other non-photodetection applications the active device (e.g., the photodetector) therefore has different responsivity for the symmetric and anti-symmetric modes. The device's responsivity would change based on the relative amplitude and phase of coherent light entering the two waveguides. In other words, the device would exhibit polarization dependent loss (PDL).

It is possible to eliminate said PDL by separating waveguides 302 and 304 so that their modes do not couple to one another; however, this solution compromises bandwidth because the total active layer width required to keep the waveguides from coupling would increase the capacitance of the photodetector. It is also possible to avoid said PDL by using two separate photodetectors in a polarization diversity receiver and connecting their electrical contacts together (e.g., similar to FIG. 1B, wherein p-electrode 120 would be disposed over two separate photodetecting regions). This solution, however, compromises bandwidth because there is a minimum width of a photodetection region mesa for it to be reliably fabricated, and having two photodetection regions of this width increases the overall capacitance in comparison to using a single region. Additionally defect states at the sidewalls of the detectors lead to dark current, and the larger total perimeter of the two separate photodetection regions versus a single photodetection region will increase the total dark current.

In FIG. 3C, waveguides 352 and 354 comprise different waveguide cross-sectional areas. Waveguides according to embodiments of the disclosure may have different cross-sectional areas due to the height, width, or shape of the waveguides; in this example, the widths of waveguides 352 and 354 differ, and the value of their waveguide widths are selected so that the absorption coefficients of modes 356 and 358 (i.e., modal confinement or gain coefficient in other applications are the same. In other words, while the mode sizes of quasi-symmetric mode 356 and quasi-anti-symmetric mode 358 are different, their absorption coefficient is the same, thereby eliminating the PDL for the active device discussed above, as the active device (e.g., the photodetector) has the same responsivity for light received from the two waveguides. The sizes of the waveguides coupling light into the device (e.g., waveguides 202 and 204 of FIG. 2A outside of device 290) do not necessarily have to comprise different cross-sectional areas in order to reduce or eliminate PDL as described above.

In embodiments of the disclosure, the cross-sectional areas of adjacent waveguides of an active device may vary (i.e., mode sizes are different but absorption coefficient is the same) at least where the waveguides overlap the active region of the device; portions of said waveguides outside of the active device (or active region) may comprise the same or differing cross-sectional areas. In embodiments such as the illustration of FIG. 3C, fundamental modes of waveguides 352 and 354 become coupled so that the two lowest-order TE modes are quasi-symmetric mode 356 and quasi-anti-symmetric mode 358. In other words, the two waveguide widths are selected so that these two modes have the same absorption coefficient. Embodiments of the disclosure may comprise more than two waveguides such that any adjacent waveguides whose modes may couple together have different cross-sectional areas.

Embodiments of the disclosure enable compact photodetectors (in other embodiments, modulators and SOAs) with two or more input waveguides to convert received light in the fundamental mode of each input waveguide into current, wherein the responsivity is the same for each input waveguide; thus, the output response is additive between the two inputs with no dependence on the relative phase or the amplitude ratio between the two inputs. These optical devices maintain high bandwidth because the two or more input waveguides are close enough to one another within the photodetector that their modes become coupled. The return loss is also low, as the two waveguides enter the same side of the optical device.

FIG. 4 is an illustration of an optical device according to an embodiment of the disclosure. Device 400 is shown to include waveguides 402 and 404, which may comprise different cross-sectional areas in order to eliminate PDL, as described above. In this embodiment, device 400 is coupled to two different waveguide sets—waveguides 412 and 414, and waveguides 422 and 424. By having two waveguide sets utilize the same optical device, instances of said optical devices may be reduced throughout a system.

In order to eliminate the possibilities of unabsorbed light reflecting from one waveguide set (i.e., to eliminate backreflections), the two waveguide sets may be used for coupling different modes or wavelengths of light. Furthermore, control circuitry may ensure only one waveguide set is used at any given time.

Figure 5:
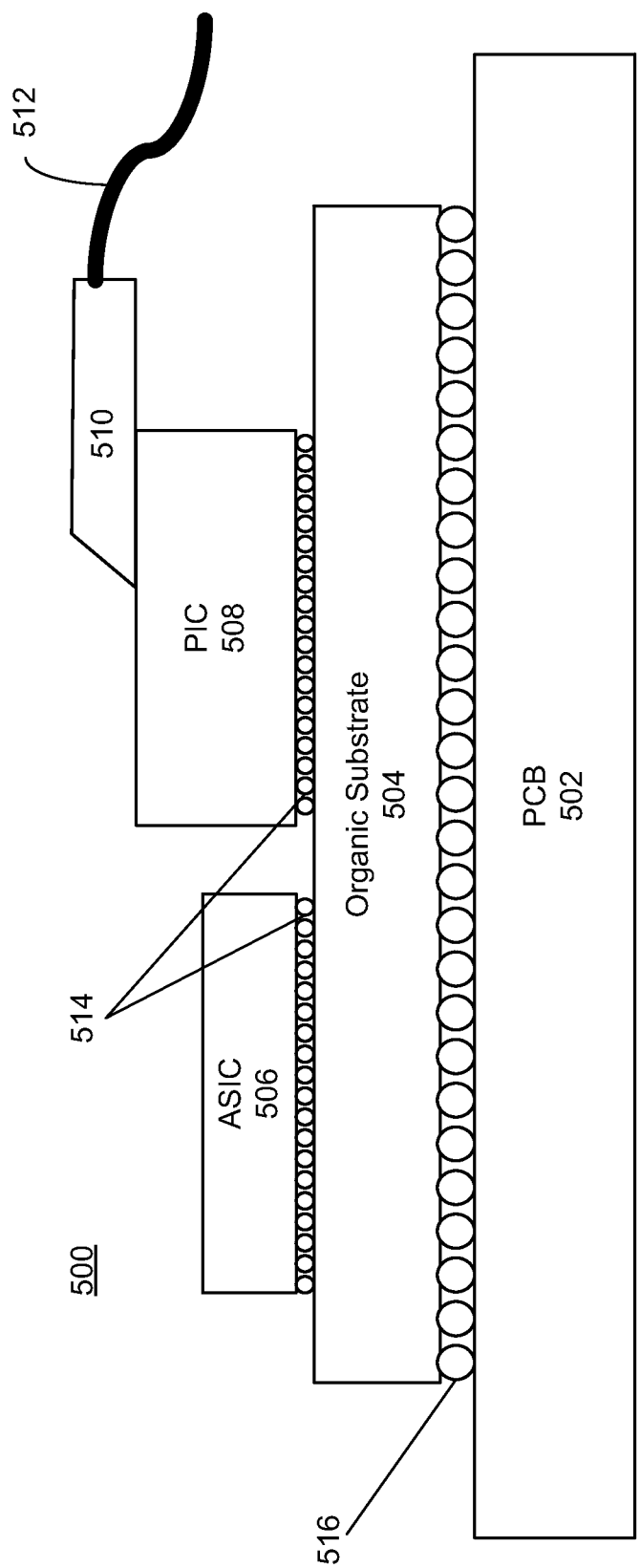
FIG. 5 is an illustration of a system including one or more optical devices according to an embodiment of the disclosure.

FIG. 5 is an illustration of a system including one or more optical devices according to an embodiment of the disclosure. In this embodiment, system 500 is shown to include printed circuit board (PCB) substrate 502, organic substrate 504, application specific integrated circuit (ASIC) 506, and photonic integrated circuit (PIC) 508. In this embodiment, PIC 508 may include one or more optical devices described above—i.e., multiport photonic devices having waveguides comprising different cross-sectional areas to eliminate PDL, as described above. PIC 508 exchanges light with fiber 512 via prism 510; said prism is a misalignment-tolerant device used to couple an optical mode on to a single mode optical fiber. The optical devices of PIC 508 are controlled, at least in part, by control circuitry included in ASIC 506.

Both ASIC 506 and PIC 508 are shown to be disposed on copper pillars 514, which are used for communicatively coupling the ICs via organic substrate 504. PCB 508 is coupled to organic substrate 504 via ball grid array (BGA) interconnect 516, and may be used to interconnect the organic substrate (and thus, ASIC 506 and PIC 508) to other components of system 500 not shown—e.g., interconnection modules, power supplies, etc.

Reference throughout the foregoing specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout the specification are not necessarily all referring to the same embodiment. Furthermore, the particular features, structures or characteristics may be combined in any suitable manner in one or more embodiments. In addition, it is appreciated that the figures provided are for explanation purposes to persons ordinarily skilled in the art and that the drawings are not necessarily drawn to scale. It is to be understood that the various regions, layers and structures of figures may vary in size and dimensions.

The above described embodiments of the disclosure may comprise SOI or silicon based (e.g., silicon nitride (SiN)) devices, or may comprise devices formed from both silicon and a non-silicon material. Said non-silicon material (alternatively referred to as "heterogeneous material") may comprise one of III-V material, magneto-optic material, or crystal substrate material.

III-V semiconductors have elements that are found in group III and group V of the periodic table (e.g., Indium Gallium Arsenide Phosphide (InGaAsP), Gallium Indium Arsenide Nitride (GaInAsN)). The carrier dispersion effects of III-V based materials may be significantly higher than in silicon based materials, as electron speed in III-V semiconductors is much faster than that in silicon. In addition, III-V materials have a direct bandgap which enables efficient creation of light from electrical pumping. Thus, III-V semiconductor materials enable photonic operations with an increased efficiency over silicon for both generating light and modulating the refractive index of light.

Thus, III-V semiconductor materials enable photonic operation with an increased efficiency at generating light from electricity and converting light back into electricity. The low optical loss and high quality oxides of silicon are thus combined with the electro-optic efficiency of III-V semiconductors in the heterogeneous optical devices described below; in embodiments of the disclosure, said heterogeneous devices utilize low loss heterogeneous optical waveguide transitions between the devices' heterogeneous and silicon-only waveguides.

Magneto-optic materials allow heterogeneous PICs to operate based on the magneto-optic (MO) effect. Such devices may utilize the Faraday Effect, in which the magnetic field associated with an electrical signal modulates an optical beam, offering high bandwidth modulation, and rotates the electric field of the optical mode enabling optical isolators. Said magneto-optic materials may comprise, for example, materials such as such as iron, cobalt, or yttrium iron garnet (YIG).

Crystal substrate materials provide heterogeneous PICs with a high electro-mechanical coupling, linear electro optic coefficient, low transmission loss, and stable physical and chemical properties. Said crystal substrate materials may comprise, for example, lithium niobate (LiNbO3) or lithium tantalate (LiTaO3).

Embodiments of the disclosure describe an apparatus comprising a first waveguide, comprising a first cross-sectional area, to receive a light comprising a first optical mode, a second waveguide, adjacent to the first waveguide, to receive a light comprising a second optical mode, orthogonal to the first optical mode, wherein the second waveguide comprises a second cross-sectional area different than the first waveguide, and a region, disposed over the first and second waveguides, to absorb or amplify light from the first and the second waveguides, wherein the region comprises at least one of an absorption region, a gain region, a phase shift region, or a variable refractive index overlap region.

In some embodiments, the cross sectional areas of the first and second waveguides can differ such that a coefficient for light comprising the second optical mode overlaps a coefficient for light comprising the first optical mode, the coefficients of the first and second optical modes to comprise at least one of an absorption, gain, phase, or modal coefficient. In some embodiments, the absorption, gain, phase, or modal coefficient for light comprising the second optical mode can be equal to the absorption, gain, phase, or modal coefficient for light comprising the first optical mode. In some embodiments, the coefficients of the first and second optical modes can be substantially similar, but not equal. In some embodiments, the apparatus comprises a semiconductor optical amplifier (SOA), the coefficients of the first and second optical mode comprise gain coefficients, and the region disposed over the first and second waveguides comprises a gain region to amplify light from the first and second waveguides. In some embodiments, the apparatus comprises an absorption modulator, the coefficients of the first and second optical mode comprise absorption coefficients, and the region disposed over the first and second waveguides comprises an absorption region to absorb light from the first and second waveguides to modulate the light. In some embodiments, the apparatus comprises a phase modulator, the coefficients of the first and second optical mode comprise phase coefficients, and the region disposed over the first and second waveguides comprises a region to modulate a phase of the light from the first and second waveguides. In some embodiments, the apparatus comprises a photodetector, the coefficients of the first and second optical mode comprise absorption coefficients, and the region disposed over the first and second waveguides comprises an absorption region to absorb light from the first and second waveguides; the absorption region can comprise an abrupt, non-tapered edge overlapping the first and second waveguides, and/or a width of the absorption region can be larger than a total width of the first and second waveguides.

In some embodiments, the light comprising the first optical mode comprises a first polarization state, and wherein the light comprising the second optical mode comprises a second polarization state orthogonal to the first polarization state.

In some embodiments, the first and second waveguides comprise silicon semiconductor material, and the region disposed over the first and second waveguides comprises III-V semiconductor material. In some embodiments, the first and second waveguides and the region disposed over the first and second waveguides comprise the same semiconductor material. In some embodiments, the first and second waveguides each comprise different widths.

In some embodiments, the apparatus can comprise a third waveguide adjacent to the second waveguide and having a third cross-sectional area different than the second waveguide.

Embodiments of the disclosure describe a system comprising an optical fiber to receive light, a polarization splitter to receive light from the optical fiber and to split and convert the light from light comprising a first polarization state in the fiber to light in a first waveguide-confined spatial mode and from light comprising a second polarization state orthogonal to the first polarization state in the fiber to light in a second waveguide-confined spatial mode comprising the same polarization state as light in the first waveguide-confined spatial mode, and an optical device. The optical device can comprise a first waveguide, comprising a first cross-sectional area, to receive the light comprising the first waveguide-confined spatial mode, a second waveguide, adjacent to the first waveguide, to receive the light comprising the second waveguide-confined spatial mode, wherein the second waveguide comprises a second cross-sectional area different than the first waveguide such that an absorption/gain coefficient for light comprising the second spatial mode is equal to an absorption/gain coefficient for light comprising the first spatial mode, and an absorption/gain region, disposed over the first and second waveguides, to absorb/amplify light from the first and the second waveguides.

In some embodiments, the first and second waveguides of the optical device comprise silicon semiconductor material, and the absorption/gain region comprises III-V semiconductor material. In some embodiments, the first and second waveguides and the absorption/gain region of the optical device comprise the same semiconductor material.

In some embodiments, the optical device comprises a semiconductor optical amplifier (SOA), the absorption/gain coefficients of the first and second optical mode comprise gain coefficients, and the absorption/gain region comprises a gain region to amplify light from the first and second waveguides.

In some embodiments, the optical device comprises a modulator, the absorption/gain coefficients of the first and second optical mode comprise absorption coefficients, and the absorption/gain region comprises an absorption region to absorb light from the first and second waveguides to modulate the light.

In some embodiments, the optical device comprises a photodetector, the absorption/gain coefficients of the first and second optical mode comprise absorption coefficients, and the absorption/gain region comprises an absorption region to absorb light from the first and second waveguides.

In some embodiments, the optical device further comprises a third waveguide adjacent to the second waveguide and having a third cross-sectional area different than the second waveguide; wherein the absorption/gain region is to absorb/amplify light from each of the first, second, and third waveguides.

Embodiments of the disclosure describe an apparatus comprising a first and a second optical coupler disposed on a same side of the apparatus, a first waveguide to receive, from the first optical coupler, a light comprising a first optical mode, a second waveguide, adjacent to the first waveguide, to receive, from the second optical coupler, a light comprising a second optical mode orthogonal to the first optical mode, and a region, disposed over the first and second waveguides, to absorb or amplify light from the first and the second waveguides wherein the region comprises at least one of an absorption region, a gain region, a phase shift region, or a variable refractive index overlap region.

In some embodiments, the second waveguide comprises a second cross-sectional area different than the first waveguide such that an absorption, gain, phase, or modal coefficient for light comprising the second optical mode is equal to an absorption, gain, phase, or modal coefficient for light comprising the first optical mode. In some embodiments, the first and second waveguides each comprise the same cross-sectional area.

In some embodiments, the region disposed over the first and second waveguides comprises at least one of first and second discrete regions corresponding to the first and second waveguides, respectively, and/or a single region disposed over both the first and second waveguides.

In some embodiments, the apparatus further comprises a third and a fourth optical coupler both disposed on a side of the apparatus opposing the first and second optical couplers; wherein the first and second waveguides are to receive light from either the first and second optical couplers or the third and fourth optical couplers.

In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

The invention claimed is:

1. An apparatus comprising:
   a first waveguide, comprising a first cross-sectional area, to receive a light produced from a first polarization state and propagate a first optical mode;
   a second waveguide, adjacent to the first waveguide, to receive a light produced from a second polarization state, orthogonal to the first polarization state, and propagate a second optical mode, wherein the second waveguide comprises a second cross-sectional area different than the first waveguide; and
   a region, disposed over the first and second waveguides, to absorb or amplify light from the first and second waveguides, wherein the region comprises at least one of an absorption region, a gain region, a phase shift region, or a variable refractive index overlap region;
   wherein an absorption, gain, or modal coefficient for light comprising the second optical mode is equal to an absorption, gain, phase, or modal coefficient for light comprising the first optical mode.

2. The apparatus of claim 1, wherein the apparatus comprises a semiconductor optical amplifier (SOA), the coefficients of the first and second optical mode comprise gain coefficients, and the region disposed over the first and second waveguides comprises a gain region to amplify light from the first and second waveguides.

3. The apparatus of claim 1, wherein the apparatus comprises an absorption modulator, the coefficients of the first and second optical mode comprise absorption coefficients, and the region disposed over the first and second waveguides comprises an absorption region to absorb light from the first and second waveguides to modulate the light.

4. The apparatus of claim 1, wherein the apparatus comprises a phase modulator, the coefficients of the first and second optical mode comprise phase coefficients, and the region disposed over the first and second waveguides comprises a region to modulate a phase of the light from the first and second waveguides.

5. The apparatus of claim 1, wherein the apparatus comprises a photodetector, the coefficients of the first and second optical mode comprise absorption coefficients, and the region disposed over the first and second waveguides comprises an absorption region to absorb light from the first and second waveguides.

6. The apparatus of claim 5, wherein the absorption region comprises an abrupt, non-tapered edge overlapping the first and second waveguides.

7. The apparatus of claim 5, wherein a width of the absorption region is larger than a total width of the first and second waveguides.

8. The apparatus of claim 1, wherein the first and second waveguides comprise a silicon semiconductor material, and the region disposed over the first and second waveguides comprises a III-V semiconductor material.

9. The apparatus of claim 1, wherein the first and second waveguides and the region disposed over the first and second waveguides comprise a same semiconductor material.

10. The apparatus of claim 1, wherein the first and second waveguides each comprise different widths.

11. The apparatus of claim 1, further comprising:
    a third waveguide adjacent to the second waveguide and having a third cross-sectional area different than the second waveguide.

12. A system comprising:
    an optical fiber to receive light;
    a polarization splitter to receive light from the optical fiber and to split and convert the light from light comprising a first polarization state in the fiber to light in a first waveguide-confined spatial mode and from light comprising a second polarization state orthogonal to the first polarization state in the fiber to light in a second waveguide-confined spatial mode comprising the same polarization state as light in the first waveguide-confined spatial mode; and
    an optical device comprising:
       a first waveguide, comprising a first cross-sectional area, to receive the light comprising the first waveguide-confined spatial mode;
       a second waveguide, adjacent to the first waveguide, to receive the light comprising the second waveguide-confined spatial mode, wherein the second waveguide comprises a second cross-sectional area different than the first waveguide such that an absorption/gain coefficient for light comprising the second spatial mode is equal to an absorption/gain coefficient for light comprising the first spatial mode; and
       an absorption/gain region, disposed over the first and second waveguides, to absorb/amplify light from the first and the second waveguides.

13. The system of claim 12, wherein the first and second waveguides of the optical device comprise a silicon semiconductor material, and the absorption/gain region comprises a III-V semiconductor material.

14. The system of claim 12, wherein the first and second waveguides and the absorption/gain region of the optical device comprise a same semiconductor material.

15. The system of claim 12, wherein the optical device comprises a semiconductor optical amplifier (SOA), the absorption/gain coefficients of the first and second optical mode comprise gain coefficients, and the absorption/gain region comprises a gain region to amplify light from the first and second waveguides.

16. The system of claim 12, wherein the optical device comprises a modulator, the absorption/gain coefficients of the first and second optical mode comprise absorption coefficients, and the absorption/gain region comprises an absorption region to absorb light from the first and second waveguides to modulate the light.

17. The apparatus of claim 12, wherein the optical device comprises a photodetector, the absorption/gain coefficients of the first and second optical mode comprise absorption coefficients, and the absorption/gain region comprises an absorption region to absorb light from the first and second waveguides.

18. The system of claim 12, wherein the optical device further comprises:
    a third waveguide adjacent to the second waveguide and having a third cross-sectional area different than the second waveguide; wherein the absorption/gain region is to absorb/amplify light from each of the first, second, and third waveguides.

19. An apparatus comprising:
    a first and a second optical coupler disposed on a same side of the apparatus;
    a first waveguide to receive, from the first optical coupler, a light produced from a first polarization state and propagate a first optical mode;
    a second waveguide, adjacent to the first waveguide, to receive, from the second optical coupler, a light produced from a second polarization state, orthogonal to the first polarization state, and propagate a second optical mode; and
    a region, disposed over the first and second waveguides, to absorb or amplify light from the first and the second waveguides wherein the region comprises at least one of an absorption region, a gain region, a phase shift region, or a variable refractive index overlap region;

wherein the second waveguide comprises a second cross-sectional area different than the first waveguide such that an absorption, gain, phase, or modal coefficient for light comprising the second optical mode is equal to an absorption, gain, phase, or modal coefficient for light comprising the first optical mode.

20. The apparatus of claim 19, wherein a portion of the first waveguide and a portion of the second waveguides have a same cross-sectional area.

21. The apparatus of claim 19, wherein the region disposed over the first and second waveguides comprises at least one of:

first and second discrete regions corresponding to the first and second waveguides, respectively; or a single region disposed over both the first and second waveguides.

22. The apparatus of claim 19, further comprising:

a third and a fourth optical coupler both disposed on a side of the apparatus opposing the first and second optical couplers; wherein the first and second waveguides are to receive light from either the first and second optical couplers or the third and fourth optical couplers.

* * * * *